(12) United States Patent
Kim et al.

(10) Patent No.: US 7,154,611 B2
(45) Date of Patent: Dec. 26, 2006

(54) SPIN ETCHER WITH THICKNESS MEASURING SYSTEM

(75) Inventors: Chung-Sik Kim, Chung Cheong Nam-do (KR); Jeong-Yong Bae, Chung Cheong Nam-do (KR)

(73) Assignee: Semes Co., Ltd. (KR)

( * ) Notice: Subject to any disclaimer, the term of this patent is extended or adjusted under 35 U.S.C. 154(b) by 399 days.

(21) Appl. No.: 10/412,120

(22) Filed: Apr. 11, 2003

(65) Prior Publication Data

US 2004/0004724 A1    Jan. 8, 2004

(30) Foreign Application Priority Data

Apr. 12, 2002   (KR) ............................ 2002-19925

(51) Int. Cl.
*G01B 11/02* (2006.01)
(52) U.S. Cl. .................................................. 356/504
(58) Field of Classification Search ................ 356/503, 356/504, 508; 73/866.5
See application file for complete search history.

(56) References Cited

U.S. PATENT DOCUMENTS

| | | | |
|---|---|---|---|
| 5,827,985 A * | 10/1998 | Grieger et al. ............. | 73/866.5 |
| 5,956,142 A * | 9/1999 | Muller et al. ............... | 356/504 |
| 6,678,055 B1 * | 1/2004 | Du-Nour et al. ............ | 356/504 |
| 6,801,321 B1 * | 10/2004 | Du-Nour ..................... | 356/504 |

FOREIGN PATENT DOCUMENTS

| | | |
|---|---|---|
| CN | 1314991 A | 9/2001 |
| JP | 56-78358 | 11/1982 |
| JP | 4094533 | 3/1992 |
| JP | 8-18-883 | 1/1998 |
| JP | 10-270414 | 10/1998 |
| JP | 10-268236 | 6/1999 |
| JP | 2000-13151 | 7/2001 |
| JP | 11-504774 | 2/2002 |
| JP | 2000-371621 | 6/2002 |
| JP | 2001-294362 | 4/2003 |
| TW | 346649 | 12/1998 |

* cited by examiner

*Primary Examiner*—Gregory J. Toatley, Jr.
*Assistant Examiner*—Michael A. Lyons
(74) *Attorney, Agent, or Firm*—Keusey, Tutunjian & Bitetto, P.C.

(57) ABSTRACT

A spin etcher with a thickness measuring system includes a rotatable spin head, etchant supply means, and etchant supply controller. A substrate is mounted upon the spin head. The etchant supply means is disposed over the substrate, and sprays an etchant onto the substrate. The etchant supply controller controls the etchant supply. The spin etcher further includes a main controller for transferring an etchant supply stop signal to the thickness measuring system and the etchant supply controller. The thickness measuring system allows a light to impinge on a surface of the substrate, and analyzes an interference signal of the light reflected from the substrate to measure a thickness of a thin film. The main controller compares a result measured by the thickness measuring system with a reference value, and transfers the etchant supply stop signal to the etchant supply controller before the measured result reaches the reference value. During a predetermined time after the etchant supply is stopped, the thin film is etched one more time by an etchant remaining on the substrate. As a result, the thickness of the thin film reaches the reference value.

17 Claims, 5 Drawing Sheets

SPIN ETCHER WITH THICKNESS MEASURING SYSTEM

FIELD OF THE INVENTION

The present invention relates to equipment for fabricating semiconductor devices and, more particularly, to a spin etcher for etching a specific layer by spraying an etchant onto a substrate mounted on a rotating spin head.

BACKGROUND OF THE INVENTION

Generally, semiconductor devices are fabricated by means of complex processes such as deposition processes where thin films are deposited on a substrate, photolithographic processes where photoresist patterns are formed on the substrate, ion implantation processes where impurities are implanted into the substrate, and etching processes where specific layers are removed. The etching process may include a dry etching process and a wet etching process. In the dry etching process, plasma is produced in a vacuum chamber to remove a thin film formed on a substrate surface. In the wet etching process, a substrate is submerged into a chemical bath to remove a thin film. A spin etcher was recently introduced, in which a vaporized etchant is sprayed onto an upper side, a lower side or an edge of a rotating substrate to etch a specific area of the substrate. Since the spin etcher has an excellent area selectivity and easily controls an etch thickness of a thin film, it is widely used to etch a thin film. Here the characteristic of "area selectivity" means an ability to etch only a specific area. Therefore, in order to adjust a thickness of a thin film, it is very significant to measure an etching end point.

Conventionally, gas elements produced as etch by-products are analyzed using a spectrometer to detect an etching end point. In this case, an etching amount error may occur due to variations in etchant concentration and variations in process conditions. The etching amount error makes it difficult to exactly adjust an etching thickness.

SUMMARY OF THE INVENTION

One purpose of the present invention is to provide a spin etcher with an etching end point detector which detects an etching end point by measuring a thickness of a thin film formed over a substrate in real time.

The present invention provides a spin etcher with a thickness measuring system which includes a rotatable spin head, etchant supply means, and etchant supply controller. A substrate is mounted upon the spin head. The etchant supply means is disposed over the substrate, and sprays an etchant onto the substrate. The etchant supply controller controls the etchant supply. The spin etcher further includes a main controller for transferring an etchant supply stop signal to the thickness measuring system and the etchant supply controller. The thickness measuring system allows a light to impinge on a surface of the substrate and analyzes an interference signal of the light reflected from the substrate to measure a thickness of a thin film. The main controller compares a result measured by the thickness measuring system with a reference value, and transfers the etchant supply stop signal to the etchant supply controller before the measured result reaches the reference value. For a predetermined time after the etchant supply is stopped, the thin film is etched one more time by an etchant remaining on the substrate. As a result, the thickness of the thin film reaches the reference value.

According to the present invention, the thickness measuring system includes a plurality of optical probes, a light source unit, a detector, and a thickness measuring controller. The optical probes are located over the substrate, and allow a light to impinge on the substrate surface and sense the reflected light. The light source unit supplies a light of a specific wavelength to the respective optical probes. The detector detects an interference signal of the reflected light transmitted from the respective optical probes. The thickness measuring controller estimates the interference signal detected from the detector to measure a thickness and transfers data on the measured thickness to the main controller. The optical probes are installed in a probe folder to prevent the etchant from corroding them.

DETAILED DESCRIPTION OF PREFERRED EMBODIMENTS

Figure 1:
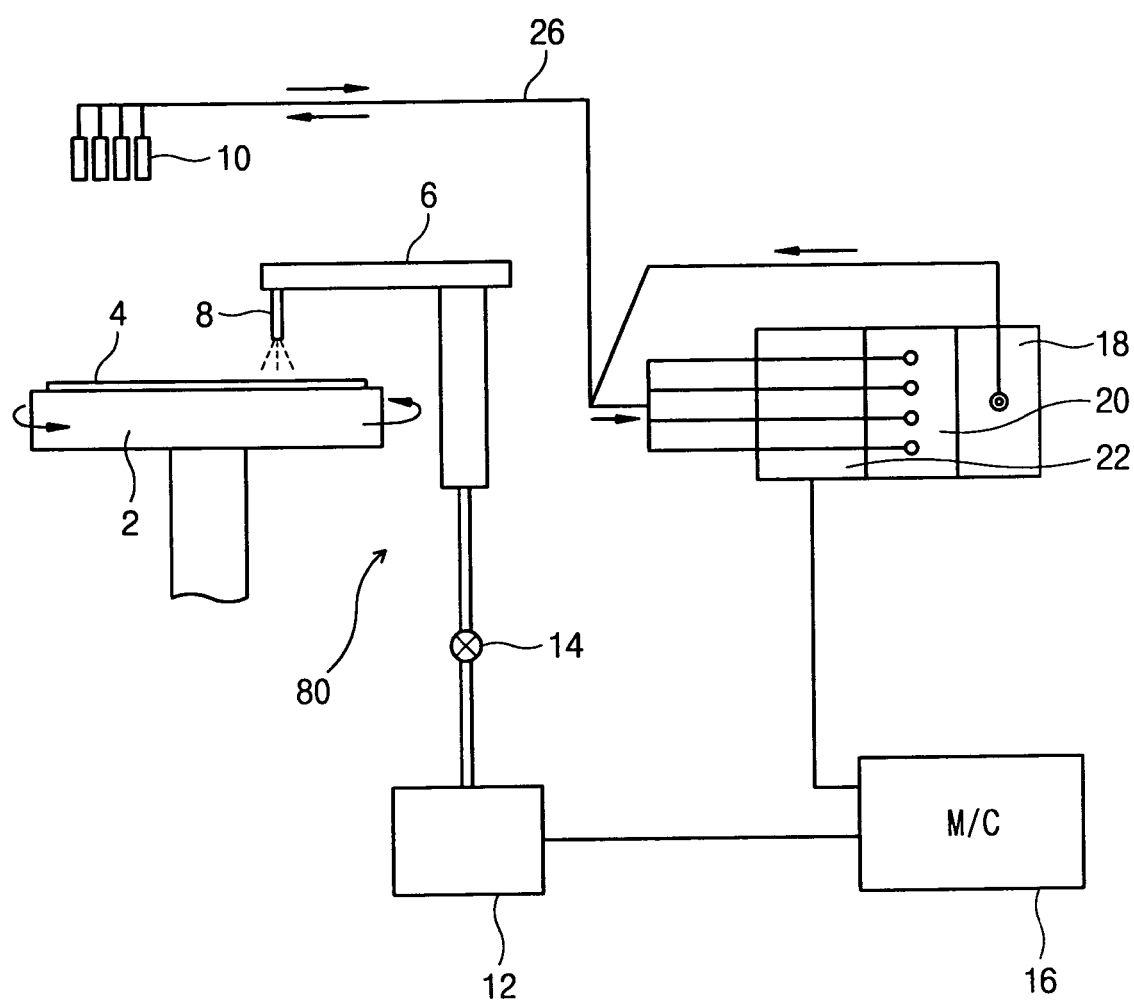
FIG. 1 is a diagram of a spin etcher with a thickness measuring system according to the present invention.

Referring to FIG. 1, a spin etcher according to the present invention includes a spin head 2, an etchant supply means 80, and a thickness measuring system. A substrate 4 is located on the spin head 2. The spin head 2 is fixed to a rotatable shaft to rotate at a constant speed. The thickness measuring system has an optical probe unit 10, a light source unit 18, a detector 20, and a thickness measuring controller 22. The optical probe unit 10 is installed apart from an upper side of the substrate 10 as far as a predetermined distance, and has a light section for emitting a light and a light receiving section for receiving a light reflected from a substrate. The light source unit 18 produces a short-wavelength light using an ultraviolet lamp or a Xenon lamp, and transmits the short-wavelength light to the light section of the optical probe unit 10. The detector 20 serves to remove noise of the light transmitted from the light receiving section of the optical probe unit 10 and to extract a required interference signal. The thickness measuring controller 22 receives an interference signal extracted from the detector 20 to measure a thickness of a thin film using a microprocessor for performing fast Fourier transformation (FFT), fitting, and operation steps. The light transmission between the optical probe unit 10 and the light source unit 18 and the light transmission between the light source unit 18 and the detector 20 are accomplished through a signal transmission line 26 having a number of optical fibers. That is, the optical probe unit 10 receives a light from the light source unit 18 through the signal transmission line 26. The received light impinges on the substrate 4. The light reflected from the substrate 4 is transmitted to the detector 20 through the signal transmission line 26. In order to exactly measure a thickness of a thin film, the thickness measuring system has a plurality of optical probe units 10. In this case, the thickness measuring system has a plurality of channels that receive optical signals of the optical probe units 10, respectively. The optical signal transmitted from the respective optical probe units 10 branches to be inputted to the respective channels.

The etchant supply means 80 has a spray nozzle 8 for spraying an etchant onto the substrate 4. The spray nozzle 8 is attached to a transfer arm 6 and is located apart from the wafer upper part as far as a predetermined distance. The etchant supply means 80 further has an etchant supply controller 12 for supplying or shutting off a specific etchant and controlling a valve 14 installed at an etchant supply line so as to supply and shut off an etchant. The spin etcher according to the invention includes a main controller 16 for monitoring and controlling the whole system. A thickness of a thin film formed over a substrate is measured in real time by the thickness measuring controller 22. Data on the measured thickness is transferred to the main controller 16. When the thickness of the thin film reaches a predetermined level, the main controller 16 transfers an etchant supply stop command to the etchant supply controller 12. Although an etchant sprayed onto a substrate is shut off, a thin film may be etched by a remaining etchant. The spin etcher stops supplying an etchant before a thickness of the thin film reaches a reference value, in view of the thickness of the thin film etched by the remaining etchant. By performing a second etch with the use of the remaining etchant, the spin etcher allows the thickness of the thin film to reach a reference value. Preferably, the second etch is performed for 10 microseconds to 2 seconds. The optical probe unit 10 is preferably installed at least about 30 cm away from the substrate surface so as to prevent damage of the optical probe. In a preferred embodiment, the optical probe unit 10 is installed about 30 cm to about 1 meter away from the substrate surface.

Figure 2:
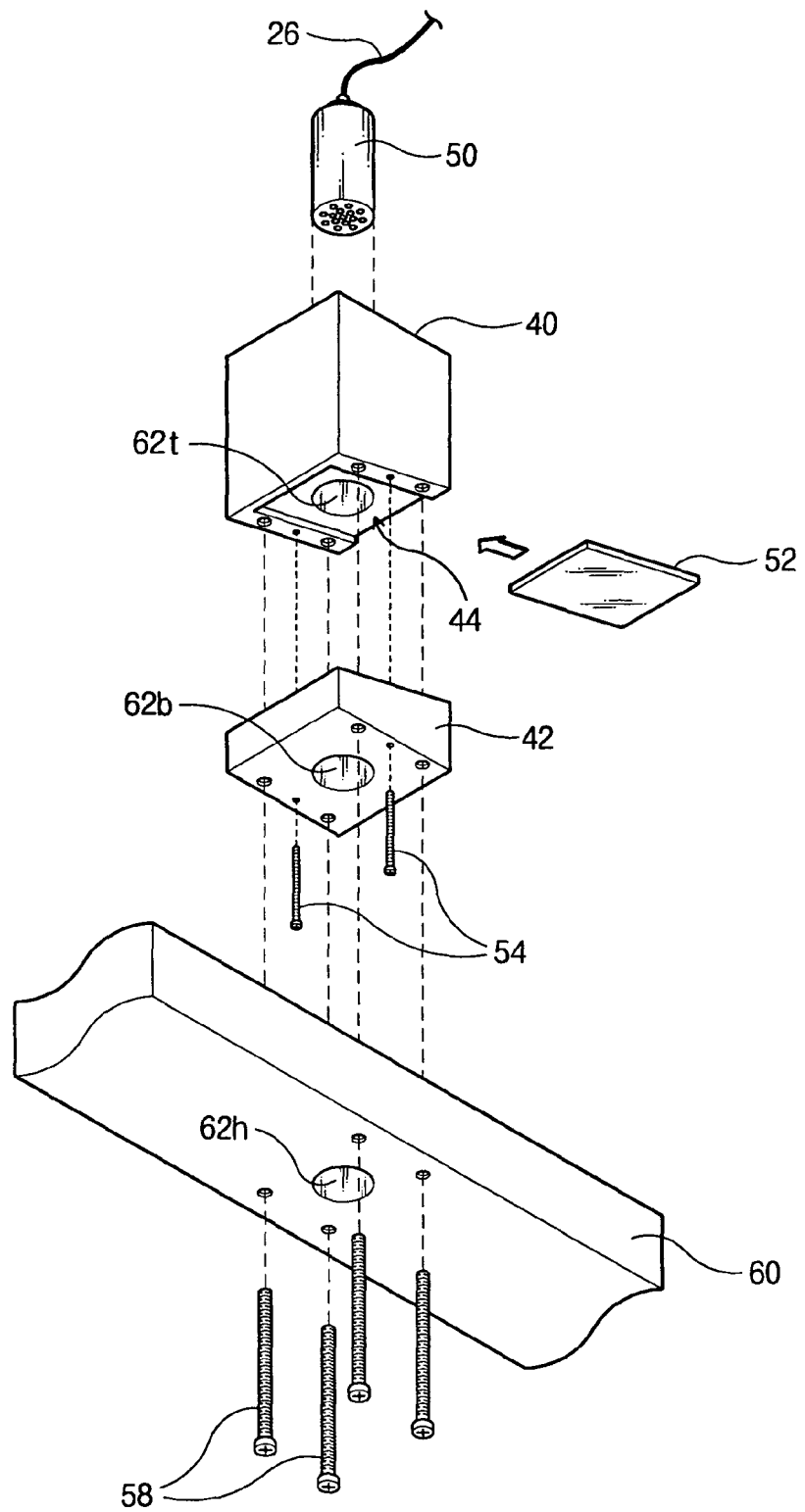
FIG. 2 is an exploded view for explaining an optical probe unit according to the present invention.

An optical probe unit according to the invention is described below with reference to FIG. 2. Referring to FIG. 2, an optical probe unit 10 includes an upper mounting block 40, a lower mounting block 42, and a mounting block supporter 60. The upper and lower mounting blocks 40 and 42 are coupled by first coupling means 54. A slide groove 44 is formed at a lower side of the upper mounting block 40. The slide groove 44 has a tilt angle of about 1 to 5 degrees. The lower mounting block 42 is coupled to the lower side of the upper mounting block 40. Thus, the slide groove 44 is disposed between the lower and upper mounting blocks 42 and 40. The slide groove 44 is open along one direction between the upper and lower mounting blocks 40 and 42. A transparent window 52 is inserted into the slide groove 44. Preferably, the transparent window 52 is longer than a depth of the slide groove 44 so as to have a predetermined protrusion at the mounting block outside. If a surface of the transparent window 52 is damaged, the transparent window 52 can be changed. An upper hole 62$t$ and a lower hole 62$b$ are formed at pivots of the upper mounting block 40 and the lower mounting block 42, respectively. If the transparent window 52 is removed, the upper and lower holes 62$t$ and 62$b$ communicate with each other. The optical probe 50 is inserted into the upper hole 62$t$. Accordingly, the upper and lower holes 62$t$ and 62$b$ are provided as a path of the light emitted or received from the optical probe 50. Since the slide groove 44 has a tilt angle of about 1 to 5 degrees, the transparent window 52 inserted into the slide groove 44 also have a tilt angle of about 1 to 5 degrees. In a case where an incident angle of a light transmitting the transparent window 52 is parallel with a direction of a normal line of the transparent window 52, a noise may occur due to interference of the light reflected from the transparent window 52 and the light reflected from the substrate. Therefore, the transparent window 52 is installed to have a predetermined tilt angle, preventing the noise caused by the light reflected from the transparent window 52.

A lower part of the lower mounting block 42 is coupled to the mounting block supporter 60 by second coupling means 58. The mounting block supporter 60 has a light gateway 62$h$. When the lower mounting block 42 is coupled to the mounting block supporter 60, the light gateway 62$h$ communicates with the lower hole 62$b$. Although not shown in the figure, the mounting block supporter 62 includes air (i.e., gas) supply means for spraying air (i.e., gas) into the light gateway 62$h$ to make an air (or gas) curtain.

Figure 3:
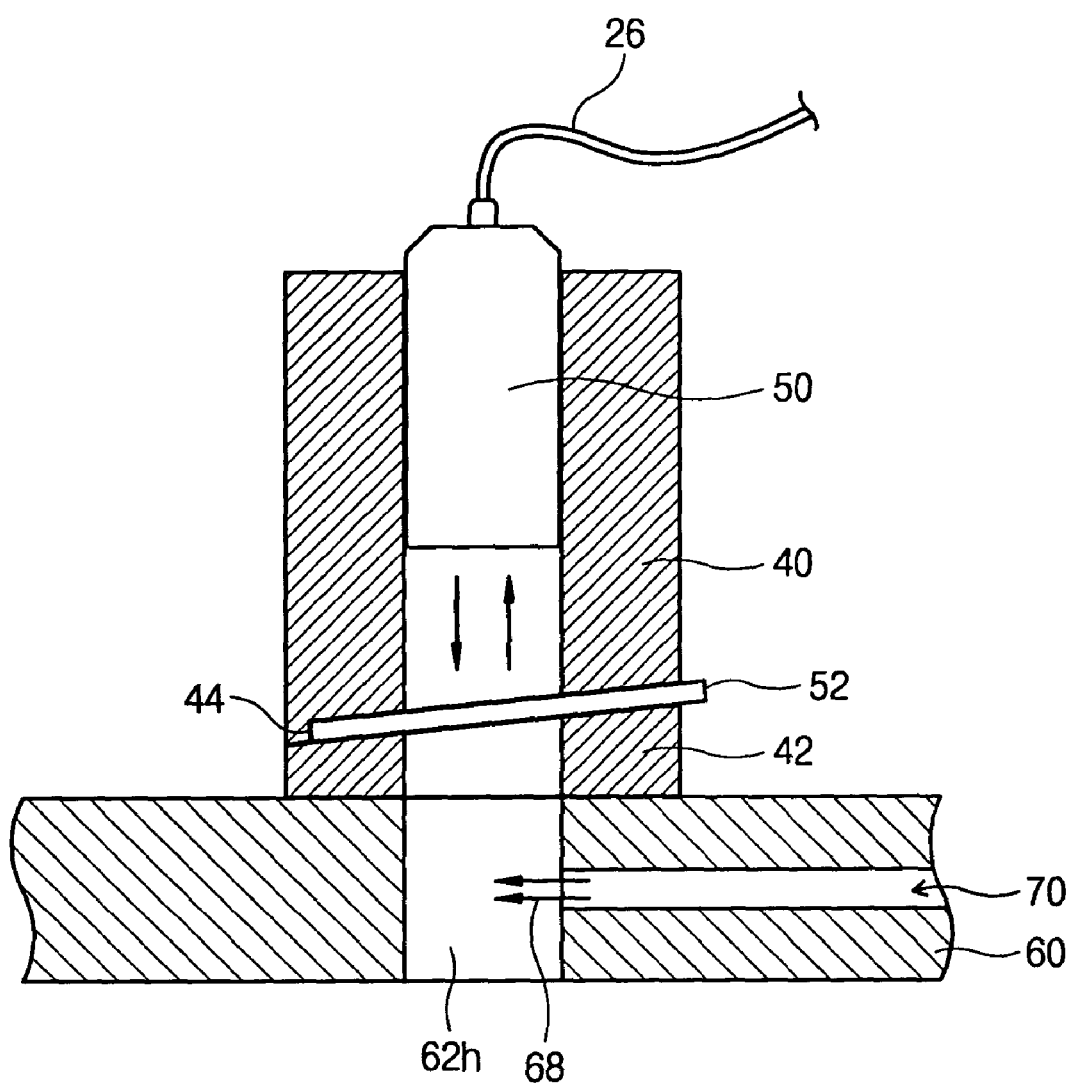
FIG. 3 is a cross-sectional view of the optical probe unit shown in FIG. 2.

FIG. 3 is a cross-sectional view of the optical probe unit shown in FIG. 2. Referring to FIG. 3, a transparent window 52 is inserted at a tilt angle of 1 to 5 degrees into a slide groove 44 between an upper mounting block 40 and a lower mounting block 42. An optical probe unit 10 connected to an optical fiber 26 is inserted into an upper part of the upper mounting block 40. The lower mounting block 42 is coupled to the mounting block supporter 60. Gas spray means 70 is installed at a sidewall of a light gateway 62$h$ formed at the mounting block supporter 60. The gas spray means 70 sprays nitrogen or air into the light gateway 62$h$ to make an air (or gas) curtain. If an etchant vaporized during an etch process is attached to the transparent window 52 through the light gateway 62$h$, a transmissivity may become bad or a surface of the transparent window 52 may be corroded by the etchant. Therefore, an air (or gas) curtain is formed in front of the transparent window 52 to prevent vapor of the etchant from attaching to the transparent window 52.

Figure 4:
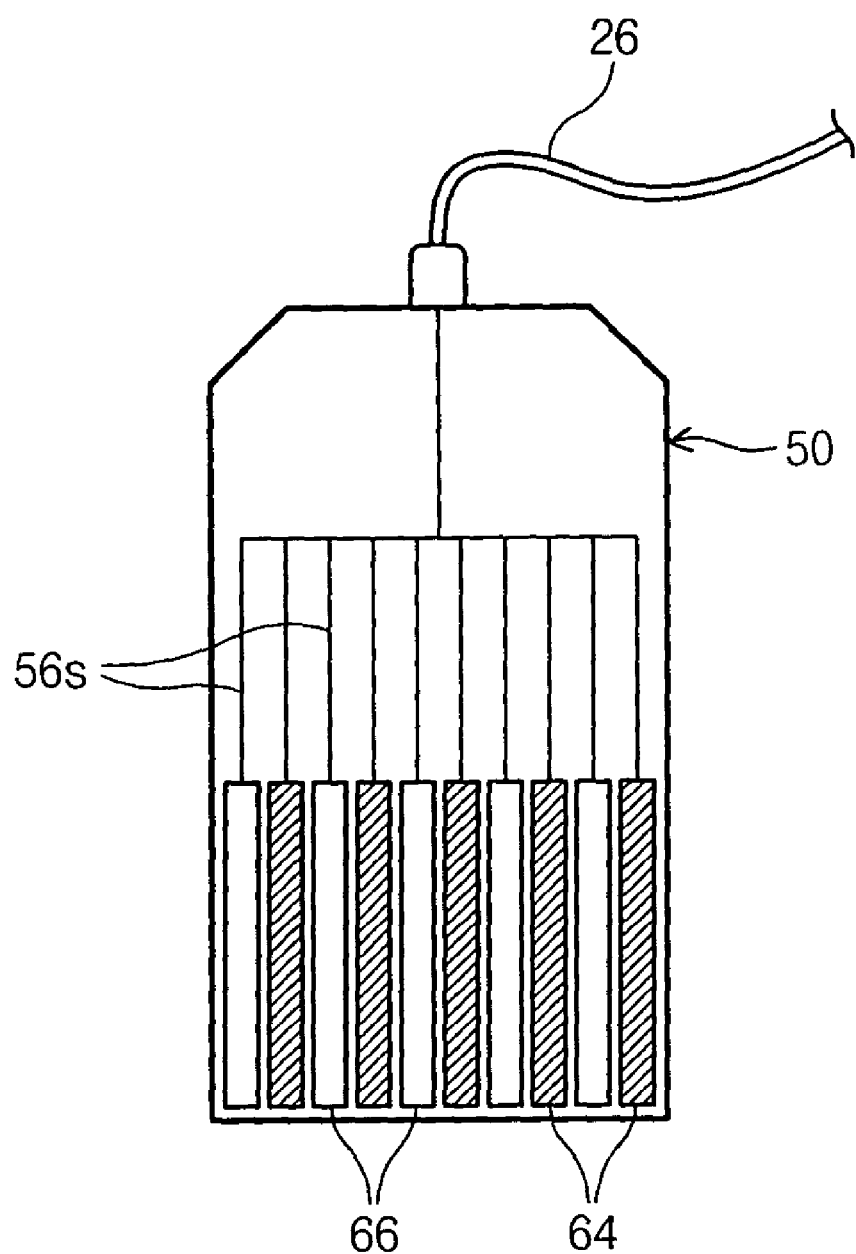
FIG. 4 is a diagram for explaining an optical probe according to the present invention.

The optical probe unit according to the invention is described below with reference to FIG. 4. Referring to FIG. 4, an optical probe unit 10 includes a plurality of light receiving sections 64 and a plurality of light sections 66. An optical fiber 56$s$ is connected to the respective light receiving sections 64 and the respective light sections 66. The optical fiber 56$s$ is connected to an optical signal transmission line 26 comprising a bunch of optical fibers.

Figure 5:
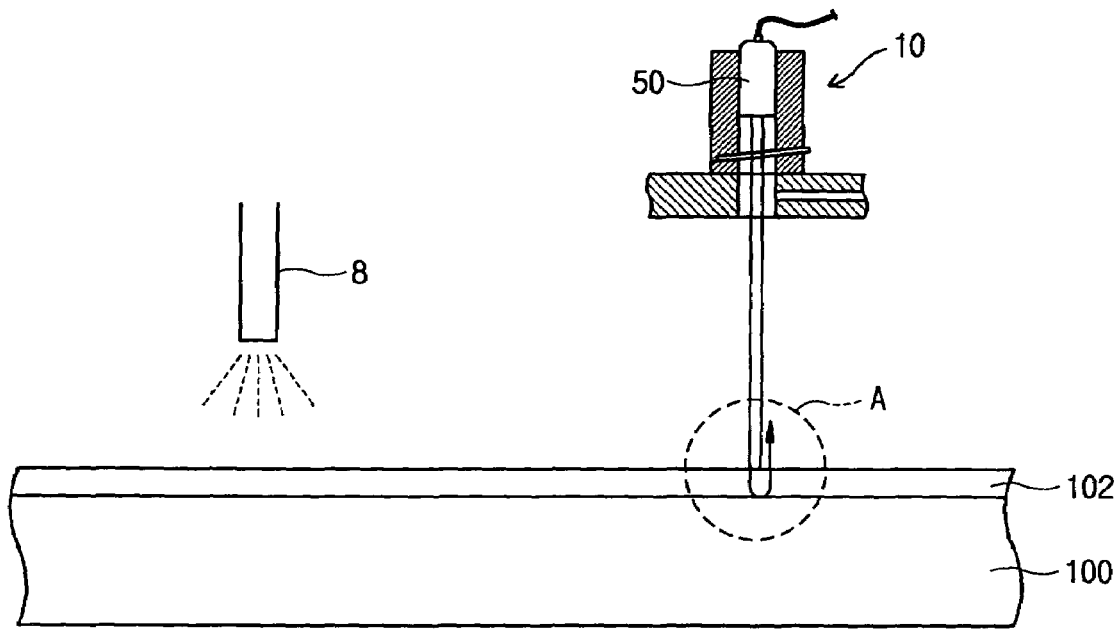
FIG. 5 and FIG. 6 are diagrams for explaining a method of measuring a thickness of a thin film formed over a substrate surface in the spin etcher according to the present invention.
Figure 6:
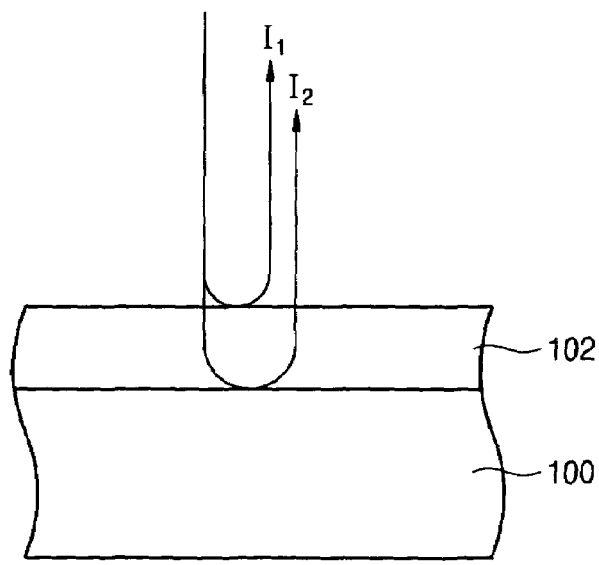

A method of measuring a thickness of a thin film formed over a substrate surface in a spin etcher according to the present invention is described below with reference to FIG. 5 and FIG. 6. Referring to FIG. 5 and FIG. 6, a thin film 102 is formed over a semiconductor substrate 100. A nozzle 8 is disposed apart from the substrate 100 as far as a predetermined distance to spray an etchant. The substrate 100 is mounted upon a rotating spin head (not shown) to rotate at a constant speed. An optical probe unit 10 is disposed over and apart from the substrate 100 as far as a predetermined distance. While the thin film 102 is etched, a light impinges on a surface of the substrate 100 from an optical probe 50 disposed over the substrate 100. FIG. 6 is an enlarged diagram of a light-impinging area "A". There is a first reflection light $I_1$ reflected from a surface of the thin film 102 and a second reflection light $I_2$ transmitting the thin film 102 to be reflected from the surface of the substrate 100, as shown in FIG. 6. The first and second reflection lights $I_1$ and $I_2$ reciprocally cause an interference, producing a light having an offset and destructive interference signal while the thin film 102 is etched. In this case, the interference signal is inputted to the optical probe 10 to be transferred to a thickness measuring controller through an optical transfer line. The thickness measuring controller estimates the inputted interference signal to measure a thickness of a thin film in real time.

As described so far, while a spin head is rotated at a constant speed, an etchant is sprayed onto a substrate that is mounted upon the spin head. Therefore, a thickness of a thin film formed over the substrate can be exactly measured in real time while the thin film is etched. Further, it is possible to prevent vapor of the etchant from damaging an optical fiber.

We claim:

1. A spin etcher comprising:
   a rotatable spin head upon which a substrate is mounted;
   etchant supply means for spraying an etchant onto the substrate, the etchant supply means being located over the substrate;
   an etchant supply controller for controlling the etchant supply;
   a thickness measuring system for allowing a light to impinge on a surface of the substrate and analyzing an interference signal of light reflected from the substrate to measure a thickness of a thin film formed over the substrate; and
   a main controller for comparing a result measured in the thickness measuring system with a reference value; and
   an etchant supply stop signal generated by the main controller to stop the etchant supply controller from supplying etchant before the measured result reaches the reference value such that the etchant supply is stopped in advance of reaching a desired thickness.

2. The spin etcher as recited in claim 1, wherein the thickness measuring system includes:
   a plurality of optical probes for allowing a light to impinge on the substrate surface and for sensing the reflected light, the optical probes being located over the substrate;
   a light source unit for supplying a light of a specific wavelength to the respective optical probes;
   a detector for detecting the interference signal of the reflected light transmitted from the respective optical probes; and
   a thickness measuring controller for estimating the interference signal detected from the detector to measure a thickness and transferring data on the measured thickness to the main controller.

3. The spin etcher as recited in claim 2, wherein the light source unit is an ultraviolet lamp or a Xenon lamp.

4. The spin etcher as recited in claim 2, wherein each of the optical probes includes a plurality of light sensors for allowing a light supplied from the light source unit to impinge on the substrate surface and a plurality of a light receiving sensors for sensing reflection light reflected from the substrate.

5. The spin etcher as recited in claim 2, further comprising an optical probe folder including:
   an upper mounting block having an upper hole installed at a pivot of the upper mounting block and a slide groove formed at a lower side of the upper mounting block, wherein the optical probe is inserted into the upper hole;
   a lower mounting block having a lower hole that is coaxial with the upper hole, the lower mounting block being coupled to the lower side of the upper mounting block;
   a removable transparent window inserted into the slide groove; and
   a mounting block supporter having a light gateway communicating with the lower hole and spray means installed at an inner wall of the light gateway;
   wherein the lower mounting block is coupled to the mounting block supporter.

6. The spin etcher as recited in claim 5, wherein the slide groove is formed to have a tilt angle of about 1 to 5 degrees, so that the inserted transparent window is tilted with respect to the probe folder.

7. The spin etcher as recited in claim 5, wherein the spray means sprays at least one of air or nitrogen into the light gateway to form a gas curtain.

8. The spin etcher as recited in claim 1, wherein a second etch for the thin film is carried out for 10 microseconds to 2 seconds after the etchant supply is stopped.

9. The spin etcher as recited in claim 1, wherein the thickness of the thin film formed over the substrate is measured in real time.

10. The spin etcher as recited in claim 2, wherein the optical probes are installed at least about 30 cm away from the substrate surface.

11. An apparatus for determining an etching end point during etching comprising:
    an etchant supply controller for controlling an etchant supply onto a substrate;
    a measuring system for measuring a thickness of a thin film formed over the substrate in real time; and
    a main controller for comparing a thickness result measured by the measuring system with a reference value, wherein the main controller transfers an etchant supply stop signal to the etchant supply controller to stop the etchant supply from supplying etchant before the thickness result reaches the reference value such that the etchant supply is stopped in advance of reaching a desired thickness.

12. The apparatus as recited in claim 11, wherein the measuring system comprises:
    a plurality of optical probes for allowing a light to impinge on a surface of the substrate and for sensing reflected light, the optical probes being located over the substrate;
    a light source unit for supplying a light of a specific wavelength to the respective optical probes;
    a detector for detecting an interference signal of the reflected light transmitted from the respective optical probes; and
    a measuring controller for receiving the interference signal detected from the detector to measure the thickness of the thin film and for transferring data on the measured thickness to the main controller.

13. The apparatus as recited in claim 12, further comprising an optical probe folder within which each of the optical probes is installed, said optical probe folder including:
    an upper mounting block having an upper hole installed at a pivot of the upper mounting block and a slide groove formed at a lower side of the upper mounting block, wherein the optical probe is inserted into the upper hole:
    a lower mounting block having a lower hole that is coaxial with the upper hole and a lower part, the lower mounting block being coupled to the lower side of the upper mounting block;
    a removable transparent window inserted into the slide groove; and
    a mounting block supporter coupled to the lower part of the lower mounting block, the mounting block supporter having a light gateway communicating with the lower hole and a spray means installed at an inner wall of the light gateway.

14. The apparatus as recited in claim 13, wherein the slide groove is formed to have a tilt angle of about 1 to 5 degrees, so that the inserted transparent window is tilted with respect to the probe folder.

15. The apparatus as recited in claim 13, wherein the spray means sprays at least one of air or nitrogen into the light gateway to form a gas curtain.

16. The apparatus as recited in claim 11, wherein a second etch for the thin film is carried out for 10 microseconds to 2 seconds after the etchant supply is stopped.

17. The apparatus as recited in claim 11, wherein the thickness of the thin film formed over the substrate is measured in real time.

\* \* \* \* \*